(12) United States Patent
Riess

(10) Patent No.: US 8,242,579 B2
(45) Date of Patent: Aug. 14, 2012

(54) CAPACITOR STRUCTURE

(75) Inventor: Philipp Riess, Munich (DE)

(73) Assignee: Infineon Technologies AG, Neubiberg (DE)

( * ) Notice: Subject to any disclaimer, the term of this patent is extended or adjusted under 35 U.S.C. 154(b) by 311 days.

(21) Appl. No.: 12/471,435

(22) Filed: May 25, 2009

(65) Prior Publication Data

US 2010/0295154 A1   Nov. 25, 2010

(51) Int. Cl.
H01L 29/92 (2006.01)
(52) U.S. Cl. .................................. 257/532; 257/307
(58) Field of Classification Search .................. 257/532, 257/307
See application file for complete search history.

(56) References Cited

U.S. PATENT DOCUMENTS

| | | | |
|---|---|---|---|
| 5,208,725 A | 5/1993 | Akcasu | |
| 6,037,621 A * | 3/2000 | Wilson | 257/296 |
| 6,383,858 B1 | 5/2002 | Gupta et al. | |
| 6,570,210 B1 * | 5/2003 | Sowlati et al. | 257/307 |
| 6,690,570 B2 * | 2/2004 | Hajimiri et al. | 361/306.1 |
| 6,747,307 B1 * | 6/2004 | Vathulya et al. | 257/307 |
| 6,822,312 B2 | 11/2004 | Sowlati et al. | |
| 7,009,832 B1 * | 3/2006 | Chen et al. | 361/306.1 |
| 7,645,675 B2 * | 1/2010 | Coolbaugh et al. | 438/381 |
| 7,705,422 B2 * | 4/2010 | Furumiya et al. | 257/532 |
| 7,838,384 B2 * | 11/2010 | Cho et al. | 438/396 |
| 2003/0161128 A1 | 8/2003 | Masuda | |
| 2006/0157770 A1 | 7/2006 | Park | |
| 2007/0123015 A1 | 5/2007 | Chinthakindi et al. | |
| 2007/0268653 A1 | 11/2007 | Kim et al. | |
| 2009/0009926 A1 * | 1/2009 | Baumgartner et al. | 361/303 |
| 2010/0164067 A1 | 7/2010 | Sugisaki et al. | |

FOREIGN PATENT DOCUMENTS

| | | |
|---|---|---|
| JP | 2003 297 930 A | 10/2003 |
| WO | 2009/044 464 A1 | 4/2009 |

* cited by examiner

Primary Examiner — Eugene Lee
(74) Attorney, Agent, or Firm — Infineon Technologies; Philip Schlazer

(57) ABSTRACT

One or more embodiments are related to a semiconductor chip comprising a capacitor, the capacitor comprising: a plurality of conductive plates, each of the plates including a first conductive strip and a second conductive strip disposed over or under the first conductive strip, the second conductive strip of each plate being substantially parallel to the first conductive strip of the same plate, the second conductive strip of each plate electrically coupled to the first conductive strip of the plate through at least one conductive via, the second conductive strips of each group of at least two consecutive plates being spaced apart from each other in a direction along the length of the plates.

22 Claims, 11 Drawing Sheets

US 8,242,579 B2

CAPACITOR STRUCTURE

FIELD OF THE INVENTION

Generally, the present invention relates to semiconductor devices, and, in particular, to semiconductor devices having capacitors.

BACKGROUND OF THE INVENTION

Capacitors may be a part of a semiconductor chip or integrated circuit. Examples of capacitors include vertical-parallel-plate (VPP) capacitors, metal-insulator-metal (MIM) capacitors, stacked capacitors and trench capacitors. New structures for capacitors are needed.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
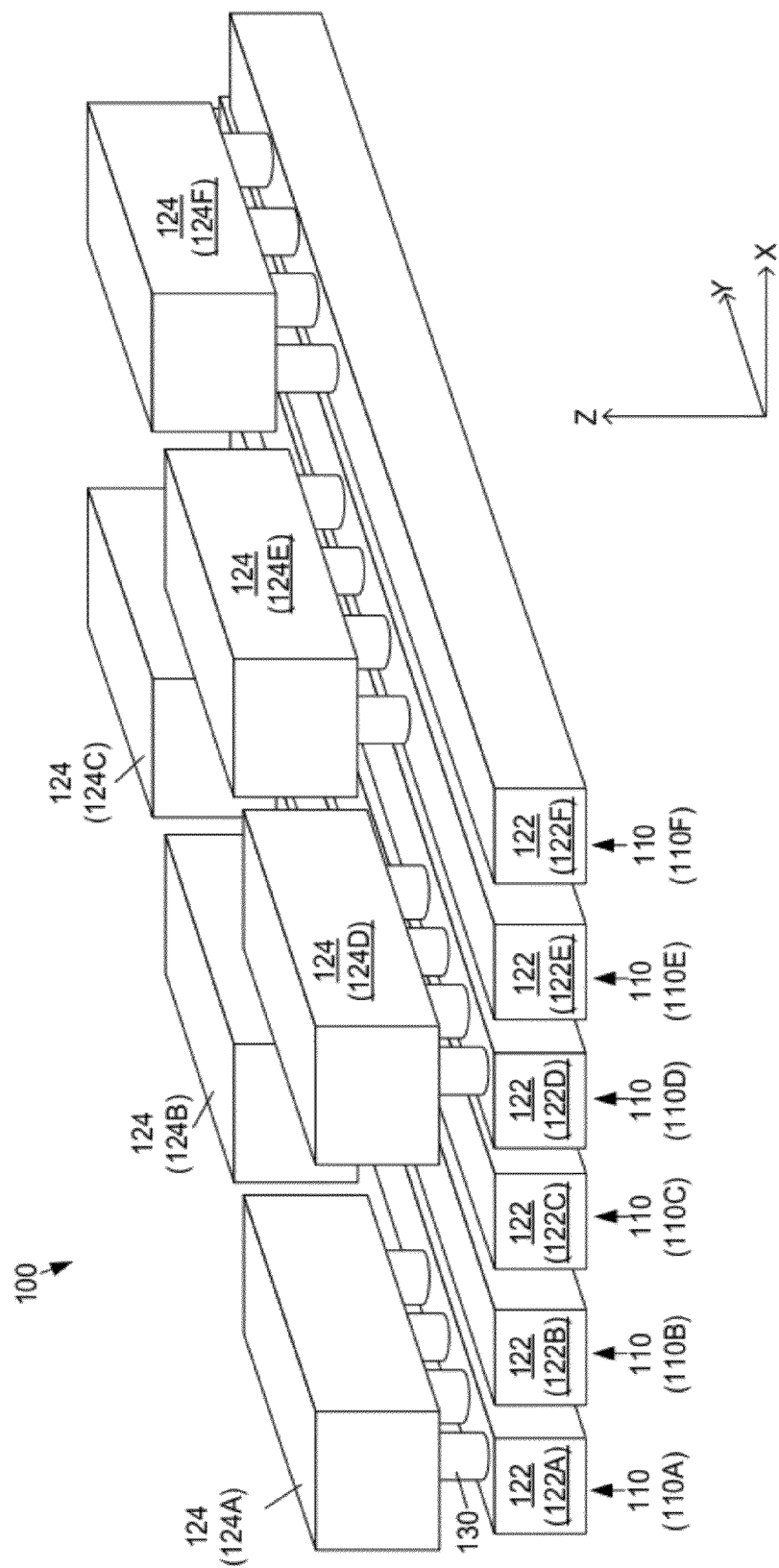
FIG. 1 shows a three dimensional view of a capacitor structure in accordance with an embodiment of the present invention.
Figure 2:
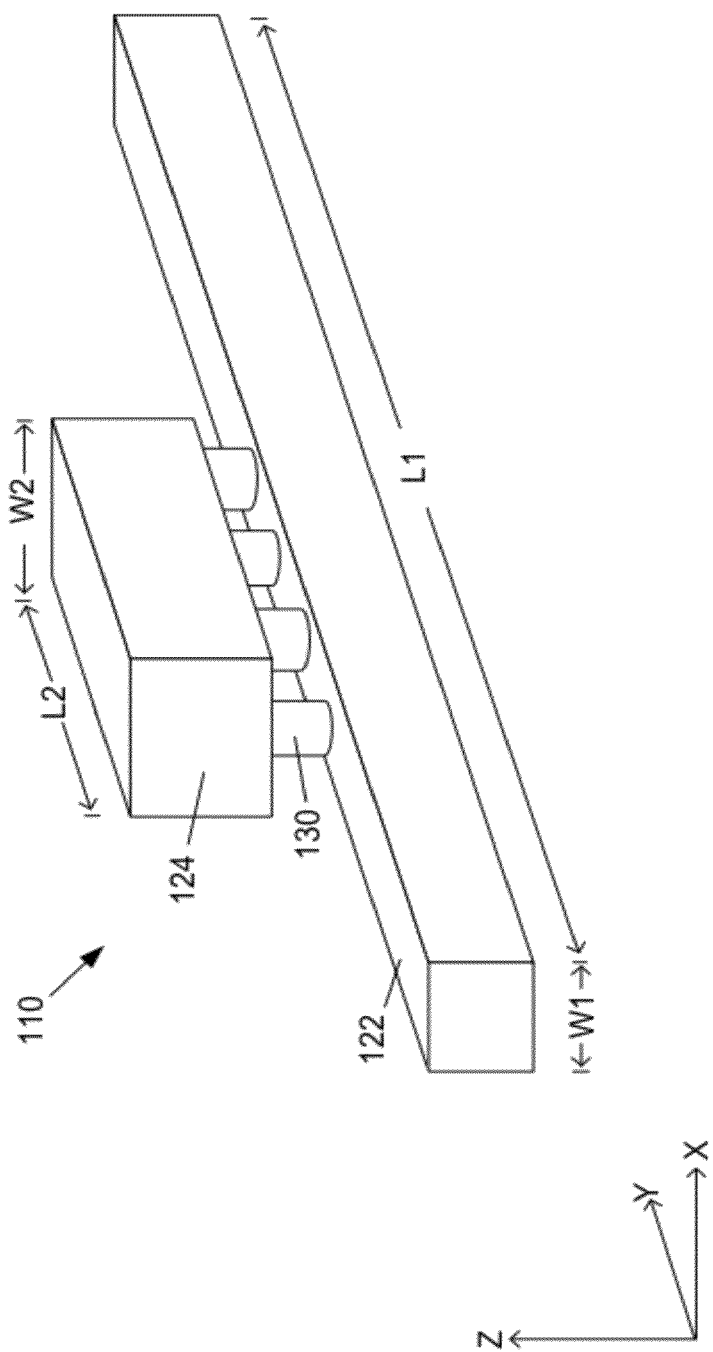
FIG. 2 shows a three-dimensional view of a conductive plate in accordance with an embodiment of the present invention.
Figure 3:
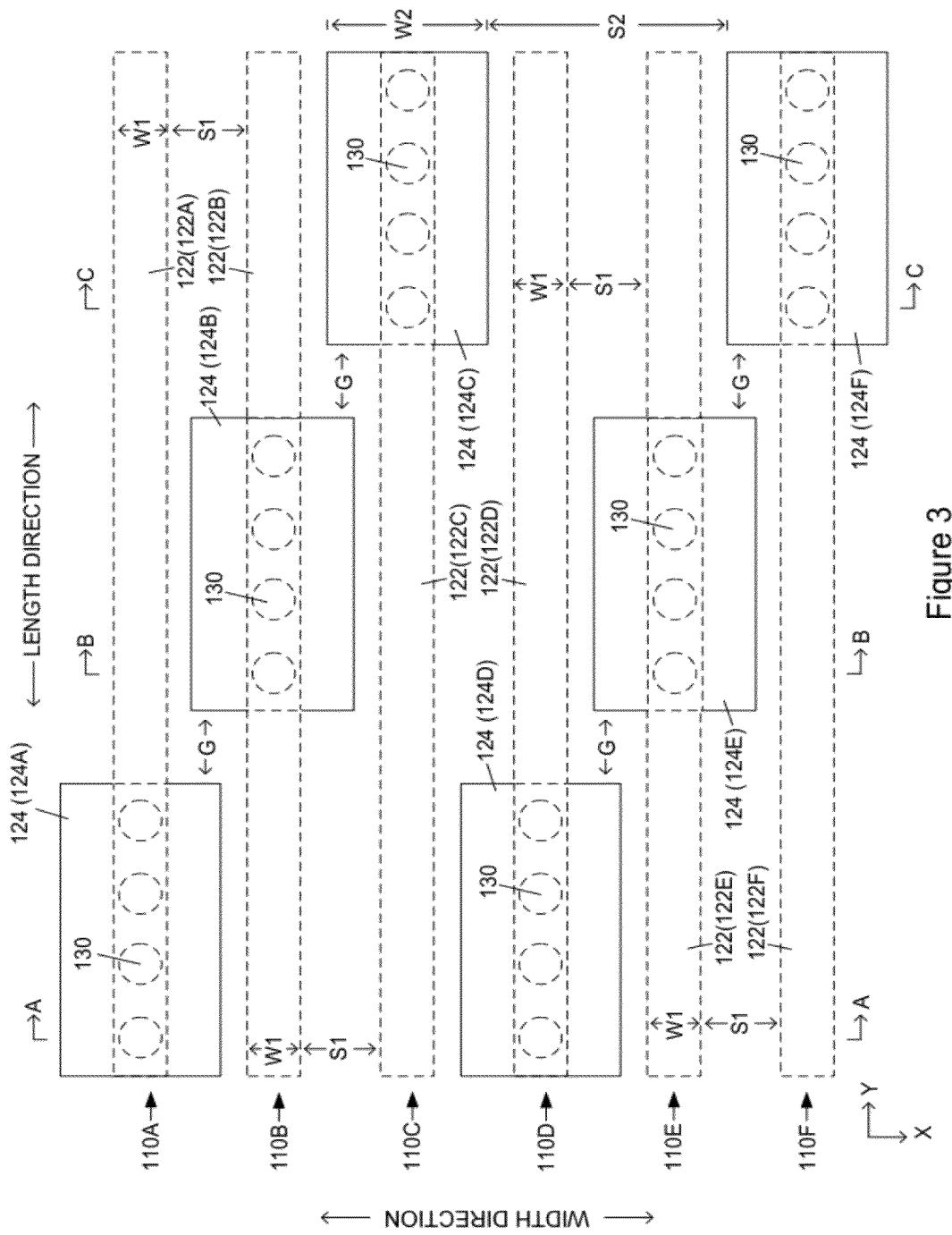
FIG. 3 shows a top view of the capacitor structure from FIG. 1.
Figure 4A:
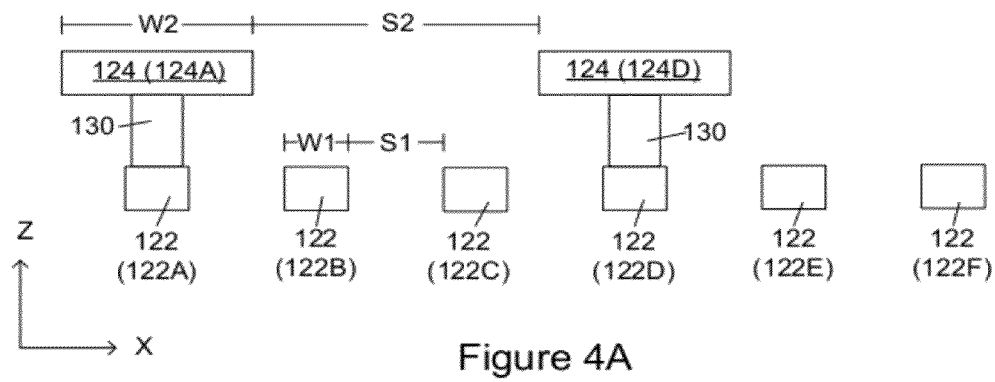
FIG. 4A shows a cross sectional view of the capacitor structure from FIG. 3.
Figure 4B:
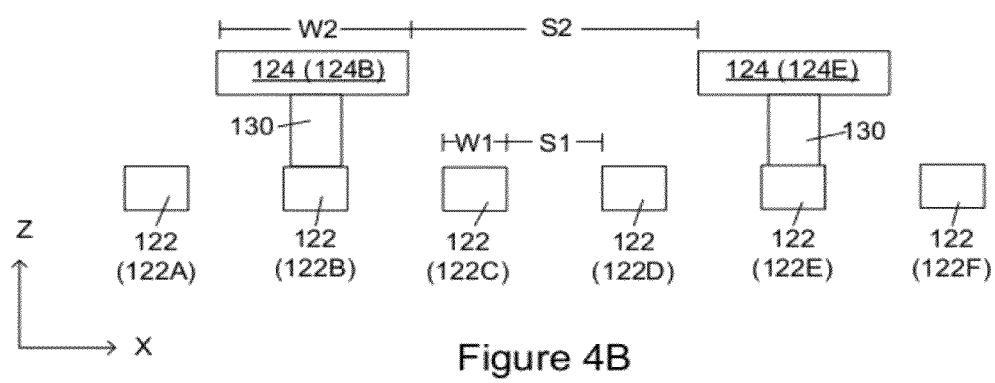
FIG. 4B shows a cross sectional view of the capacitor structure from FIG. 3.
Figure 4C:
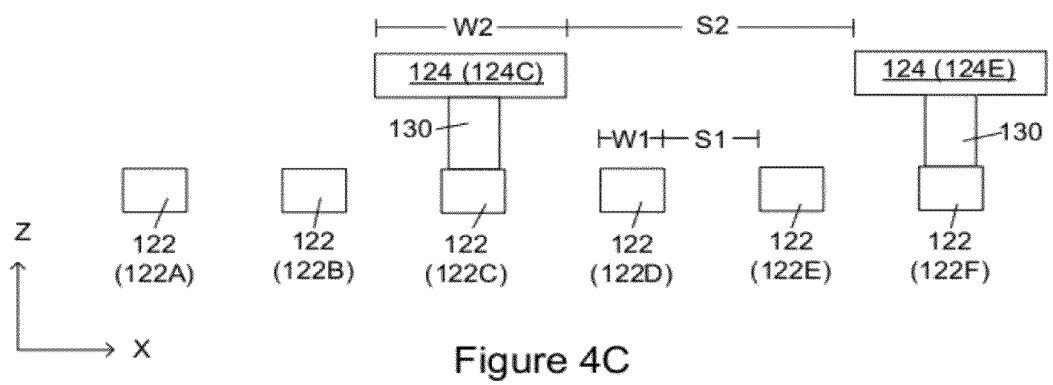
FIG. 4C shows a cross sectional view of the capacitor structure from FIG. 3.

FIG. 1 shows a three dimensional view of a capacitor structure 100 which is an embodiment of the present invention. FIG. 2 shows an example of a conductive plate 110 from the capacitor structure 100 of FIG. 1. FIG. 3 shows a top view of the same capacitor structure 100 from FIG. 1. FIG. 4A shows a cross sectional view of the same capacitor structure 100 through the cross section AA from FIG. 3. FIG. 4B shows a cross sectional view of the capacitor structure 100 through the cross section BB from FIG. 3. FIG. 4C shows a cross sectional view of the capacitor structure 100 through the cross section CC from FIG. 3.

Referring to FIG. 1, it is seen that the capacitor structure 100 comprises a plurality of conductive plates 110. These are shown as conductive plates 110A through 110F. As noted, FIG. 2 shows an example of a conductive plate 110 from FIG. 1. The conductive plates 110 may be alternating coupled together to form first and second electrodes of the capacitor structure 100. For example, the conductive plates 110A,C,E may be electrically coupled together to form a first capacitor electrode of the capacitor 100 while conductive plates 110F, G,J may be electrically coupled together to form a second electrode for the capacitor 100. The conductive plates 110A, C,E may be referred to as first conductive plates which form a first capacitor electrode. Generally, the first capacitor electrode may include one or more first conductive plates. The conductive plates 110F,G,J may be referred to as second conductive plates which form a second electrode of the capacitor 100. Generally, the second electrode may include one or more second conductive plates.

In one or more embodiments, the conductive plates 110 of the capacitor structure 100 may be arranged so that they are substantially parallel to each other. In one or more embodiments, the conductive plates 110 may be spacedly disposed from each other. In one or more embodiments, the conductive plates may be spacedly disposed from each other along a first lateral direction. In one or more embodiments, the first lateral direction may be the width direction corresponding to the width of the plates. In the embodiment shown in FIG. 1, the first lateral direction is the X-direction.

Referring to FIG. 2, each of the conductive plates 110 includes a first conductive strip 122 and a second conductive strip 124 disposed over the first conductive strip 122. Each first conductive strip 122 may be electrically coupled to a second conductive strip 124 by one or more conductive vias 130. In one or more embodiments, the first conductive strip 122 may be substantially parallel to the second conductive strip 124.

In the embodiment of the conductive plate 110 shown in FIG. 2, a single first conductive strip 122 is coupled to a corresponding single second conductive strip by at least one conductive via 130. However, other embodiments, it is possible that two or more second strips 124 may each be coupled to a single first strip 122, each by at least one conductive via 130. For example, two or more second conductive strips 124 may spacedly disposed along the length L1 of the conductive plate 110. In one or more embodiments, the first conductive strip 122 of a conductive plate 110 may be substantially parallel to the one or more second conductive strips 124 of the same conductive plate 110. In one or more embodiments, each of the conductive plates 110 may be substantially vertically disposed.

In the embodiment shown in FIGS. 1-3 (i.e. FIG. 1, FIG. 2, FIG. 3), the conductive vias 130 are shown as having a circular cross section, however, more generally, the conductive vias may have any cross sectional shape including, but not limited to, circular, elliptical, square and rectangular. In addition, in one or more embodiments, the conductive vias may taper. For example, they may be wider at the top and narrower at the bottom.

Referring to FIGS. 1-4 (i.e., FIGS. 1, 2, 3, 4A, 4B, 4C), in one or more embodiments, all of the first conductive strips 122 of the capacitor structure 100 may be arranged so that they are substantially parallel to each other. Each of the first conductive strips 122 may have a first lateral dimension extending in a first lateral direction. In one or more embodiments, the first lateral direction may be the width direction of the first conductive strips and the first lateral dimension of the first conductive strips may be the width W1 of the first conductive strips. In the embodiment shown in FIGS. 1-4, the first lateral direction corresponds to the X-direction. The width direction of the first conductive strips 122 may also correspond to the width direction of the conductive plates 110. FIG. 2 shows a width W1 of a first conductive strip 122.

Each of the first conductive strips 122 may have a second lateral dimension extending in a second lateral direction different from the first lateral direction. In one or more embodiments, the second lateral direction may be substantially perpendicular to the first lateral direction. In one or more embodiments, the second lateral direction may be the length or longitudinal direction of the first conductive strips 122. The second lateral dimension may correspond to the length of the first conductive strips 122. FIG. 2 shows a length L1 of a first conductive strip 122. In one or more embodiments, the length L1 of the first conductive strips 122 may be greater than the width W1 of the first conductive strips 122. In the embodiment shown in FIGS. 1-4, the second lateral dimension (e.g. along the length of the first conductive strips) corresponds to the Y-direction. In one or more embodiments, the length direction of the first conductive strips 122 also corresponds to the length direction of the conductive plates 110.

Hence, in the embodiment shown in FIGS. 1-4, the first lateral direction of the first conductive strips 122 (e.g. along the width) is the X-direction and the second lateral direction of the first conductive strips 122 (e.g. along the length) is the Y-direction. As noted, in the embodiment shown in FIGS. 1-4, the first conductive strips 122 are shown having a width W1 in the X-direction and a length L1 in the Y-direction. In one or more embodiments, the length L1 may be greater than the width W1. In one or more embodiments, the length direction of a conductive plate 110 corresponds to the length direction of its corresponding first conductive strip 122. Likewise, in one or more embodiments, the width direction of a conductive plate 110 corresponds to the width direction of its corresponding first conductive strip 122.

Referring to FIG. 2, the second conductive strips have width W2 in the first lateral direction or X-direction (e.g. width direction) and a length L2 in the second lateral direction or Y-direction (e.g. length or longitudinal direction). In one or more embodiments, the width W2 of the second conductive strips may be less than the length L2 of the second conductive strips. However, in another embodiment, the dimension of the second conductive strips 124 in the first lateral direction or X-direction (e.g. width direction) may be greater than the dimension in the second lateral direction or Y-direction (e.g. length dimension). Likewise, in another embodiment, the dimension of the second conductive strips 124 in the first lateral direction or X-direction may be substantially the same as the dimension of the second conductive strips 124 in the second lateral dimension or Y-direction. In one or more embodiments, all of the second conductive strips 124 of the capacitor structure 100 may be substantially parallel to each other.

Referring to FIG. 3 and FIGS. 4A-C (i.e., FIGS. 4A, 4B, 4C), each of the first conductive strips 122 may be separated from an adjacent first conductive strip 122 by a distance S1 in the X-direction. The pitch of the first conductive strips 122 in the X-direction may correspond to a distance P1=W1+S1. In one or more embodiments, the pitch P1 of the first conductive strips 122 in the X-direction may be a minimum pitch. In one or more embodiments, the minimum pitch may be determined by minimum distances achievable by photolithography.

In one or more embodiments, the second conductive strips 124 may be arranged such that the second conductive strips 124 of adjacent conductive plates 110 (e.g. two consecutive conductive plates 110) are spaced apart along the Y-direction (e.g. along the length of the first conductive strips 122 or the length of the conductive plates 110). For example, referring to FIG. 3, it is seen the second conductive strip 124B is spaced apart along the Y-direction from the second conductive strip 124A by a distance G. Likewise, the second conductive 124B is spaced apart along the Y-direction from the conductive strip 124C by a distance G. Likewise, second conductive strip 124C is spaced apart from second strip 124D along the Y-direction by a distance G. The same is true for second strips 124D and 124E. The same is true for second strips 124E and 124F.

In one or more embodiments, the second conductive strips 124 may be arranged such that the second conductive strips 124 of at least three consecutive conductive plates 110 (for example consecutive plates 110A,B,C, or consecutive plates 110B,C,D, or consecutive plates 110C,D,E, or consecutive plates 110D,E,F) are all spaced apart from each other along the Y-direction (e.g. along the length of the first conductive strips 122 or the length of the conductive plates 110).

As an example, referring to FIG. 3, plates 110A,B,C are three consecutive plates. The corresponding second strips 124 are second strips 124A,B,C. It is seen that second strips 124A,B,C are all spaced apart from each other in the Y-direction (e.g. in the length direction). Likewise, plates 110B,C,D are three consecutive plates. It is seen that the corresponding second conductive strips 124B,C,D are all spaced apart from each other in the Y-direction (e.g. in the length direction). Likewise, plates 110C,D,E are three consecutive plates. The corresponding second strips 124A,B,C are spaced apart in the Y-direction (e.g. in the length direction). Likewise, plates 110D,E,F are consecutive plates. The corresponding second strips 124D,E,F are spaced apart in the Y-direction (e.g. in the length direction).

In one or more embodiments, the second conductive strips 124 may be arranged such that the second conductive strips 124 of at least N consecutive conductive plates 110 are all spaced apart from each other along the Y-direction (e.g. along the length of the first conductive strips 122 or the length of the conductive plates 110). N may be 2, 3, 4, 5, 6, 7, or 8. N may be greater than 8. N may be equal to M where M is the number of conductive plates 110 in a capacitor arrangement.

Referring to FIG. 3 and to FIGS. 4A,B,C, in the embodiment shown, each group of four consecutive plates include at least two second conductive strips 124 that overlap in the Y-direction. This corresponds to the longitudinal or length direction of the first conductive strips 122 (or to the longitudinal or length direction of the conductive plates 110). For example, the group of four consecutive plates 110A,B,C,D includes second conductive strips 124A and 124D that overlap in the Y-direction. Likewise, the group of four consecutive plates 110B,C,D,E includes second conductive strips 124B and 124E that overlap in the Y-direction. Likewise, the group of four consecutive plates 110C,D,E,F includes second conductive strips 124C and 124F which overlap in the Y-direction (e.g. the direction along the length of the first conductive strips 122 or along the length of the plates 110).

In other embodiments, each group of three consecutive plates 110 may include at least two second conductive strips 124 that overlap in the Y-direction (e.g. length direction). In one or more embodiments, each group of N consecutive plate 110 may include at least two conductive strips 124 that overlap in the Y-direction (e.g. length direction). N may, for example, be 2, 3, 4, 5, 6, 7, or 8. N may be more than 8. N may be M where M is the number of conductive plates 110 in the capacitor structure.

Referring to FIG. 3 and FIGS. 4A-C, the second conductive strips 124 may have a first lateral dimension or width W2 in the X-direction. Each second conductive strip 124 may be separated by a distance S2 from the next or adjacent second conductive strip that occurs along the X-direction (e.g. that overlaps in the Y-direction). For example, the second conductive strip 124A may be a distance S2 from the second conductive strip 124D. It is seen that conductive strip 124A and conductive strip 124D overlap along the Y-direction. Hence, second strip 124A is adjacent to second strip 124D in the X-direction (e.g. in a direction along the width of the first conductive strips 122 or along the width of the plates 110). Also, for example, the second conductive strip 124B may be a distance S2 from the second conductive strip 124E. The second strip 124B overlaps with the second strip 124E along the Y-direction. The second strip 124B is adjacent to the second strip 124E in the X-direction (e.g. in the width direction). Also, for example, the second conductive strip 124C may be a distance S2 from the second conductive strip 124F. Again, it is seen that the second strip 124C overlaps with the second strip 124F along the Y-direction and the second strip 124C is adjacent to the second strip 124F in the X-direction (e.g. width direction). In the X-direction, in one or more embodiments, the pitch between adjacent second conductive strips 124 may be a pitch P2=W2+S2. In one or more embodiments, the pitch P2 between adjacent second conductive strips 124 in the X-direction may be a relaxed pitch (e.g. greater than minimum pitch).

In the embodiment shown, the second conductive strips 124 are arranged over the first conductive strips 122. Hence, in one or more embodiments, the first conductive strips 122 may be formed as part of a lower metallization level Mn while the second conductive strips may be formed as part of an upper metallization level Mn+1 which is above the lower metallization level Mn. The lower and upper metallization levels may be part of a semiconductor chip or an integrated circuit. The lower metallization level Mn and the upper metallization level Mn+1 may be adjacent metallization levels.

In one or more embodiments, the widths of each of the first and/or second conductive strips may be substantially uniform along the length of the strip. In one or more embodiments, each of the second conductive strips may have the shape of a parallelepiped. In one or more embodiments, the parallelepiped may be a cuboid (six rectangular faces). In one or more embodiments, the cuboid may be a cube. Other shapes are also possible.

In one or more embodiments, each of the conductive strips 122, 124 of a plate 110 may be substantially horizontally disposed. In an embodiment, the second strip 124 may be above the first strip 122 in an ascending arrangement. In another embodiment, the second strip 124 may instead be below the first strip 122 in a descending arrangement.

In an embodiment, the ascending arrangement of conductive strips may be such that the conductive plate has a vertical component. For example, in one or more embodiments, each of the conductive plates may be substantially vertically disposed. In another embodiment, the first and second conductive strips of each conductive plate may have a step-like arrangement so that the conductive plate has a vertical component but is tilted.

In one or more embodiments, each of the conductive plates 110 may be a substantially vertical plate. In one or more embodiments, the plates 110 may be substantially parallel to each other. In one or more embodiments, the capacitor structure 100 may be a vertical parallel plate capacitor.

In one or more embodiments, a capacitor of the present invention includes a first capacitor electrode and a second capacitor electrode. The first capacitor electrode may comprise one or more electrically coupled first conductive plates. The second capacitor electrode may comprise one or more electrically coupled second conductive plates. The conductive plates may be arranged alternatingly such that a second plate follows a first plate and a first plate follows a second plate, etc. The first and second conductive plates may be said to be opposite plates. In one or more embodiments, the conductive plates may have any shape. In one or more embodiments, each of the conductive plates of the first capacitor electrode and each of the conductive plates of the second capacitor electrode may be substantially vertically disposed. In one or more embodiments, the capacitor may be a vertical parallel plate capacitor.

Referring to FIGS. 1-4, each of the conductive plates 110 of the capacitor structure 100 may be separated from an adjacent plate by a dielectric. Generally, any dielectric may be used. In one or more embodiments, the dielectric may include an oxide, a nitride, an oxynitride and combinations thereof. The dielectric may comprise a high-k material. The high-k material may have a dielectric constant greater than that of silicon dioxide. In one or more embodiments, the high-k material may have a dielectric constant greater than about 3.9. In one or more embodiments, the dielectric may be a gas. In one or more embodiments, the dielectric may be air. In one or more embodiments, the dielectric may be a vacuum.

Figure 5:
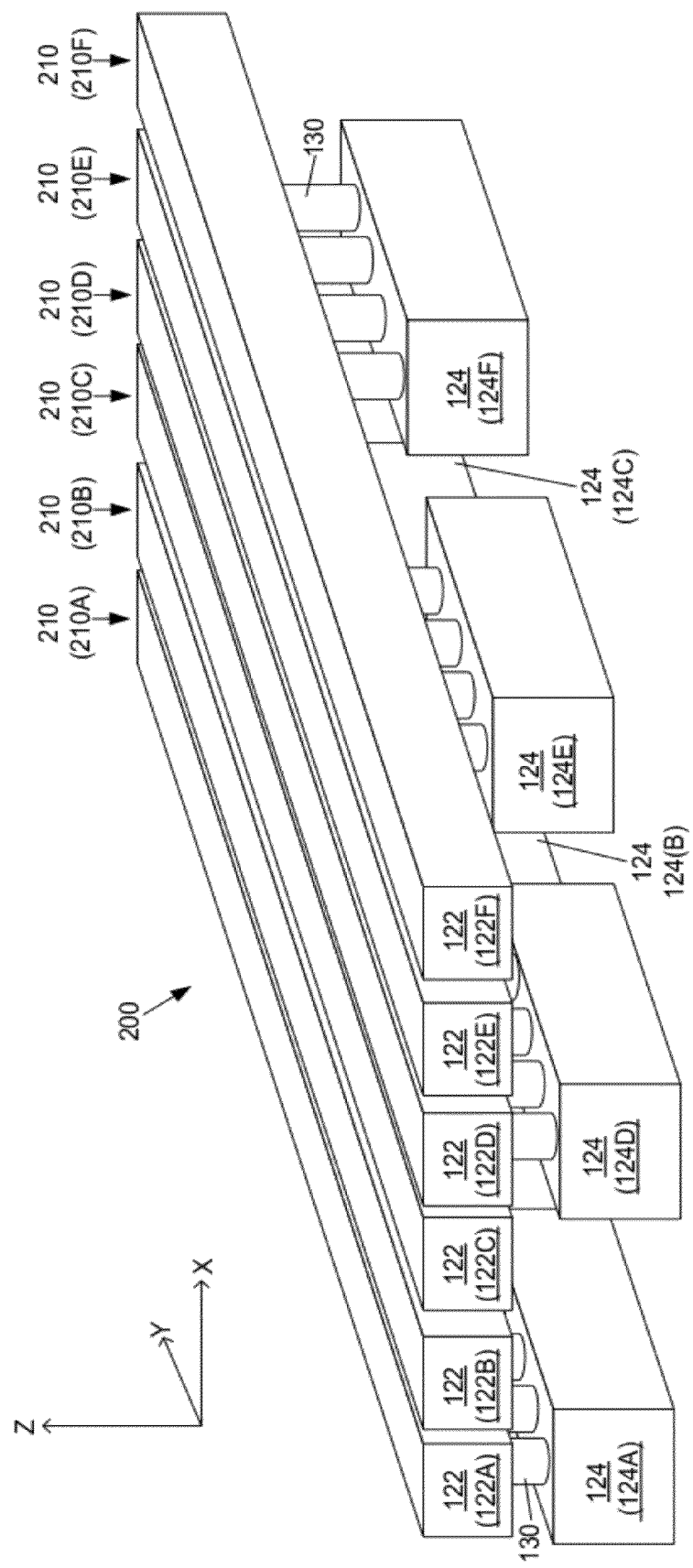
FIG. 5 shows a three dimensional view of a capacitor structure in accordance with an embodiment of the present invention.
Figure 6:
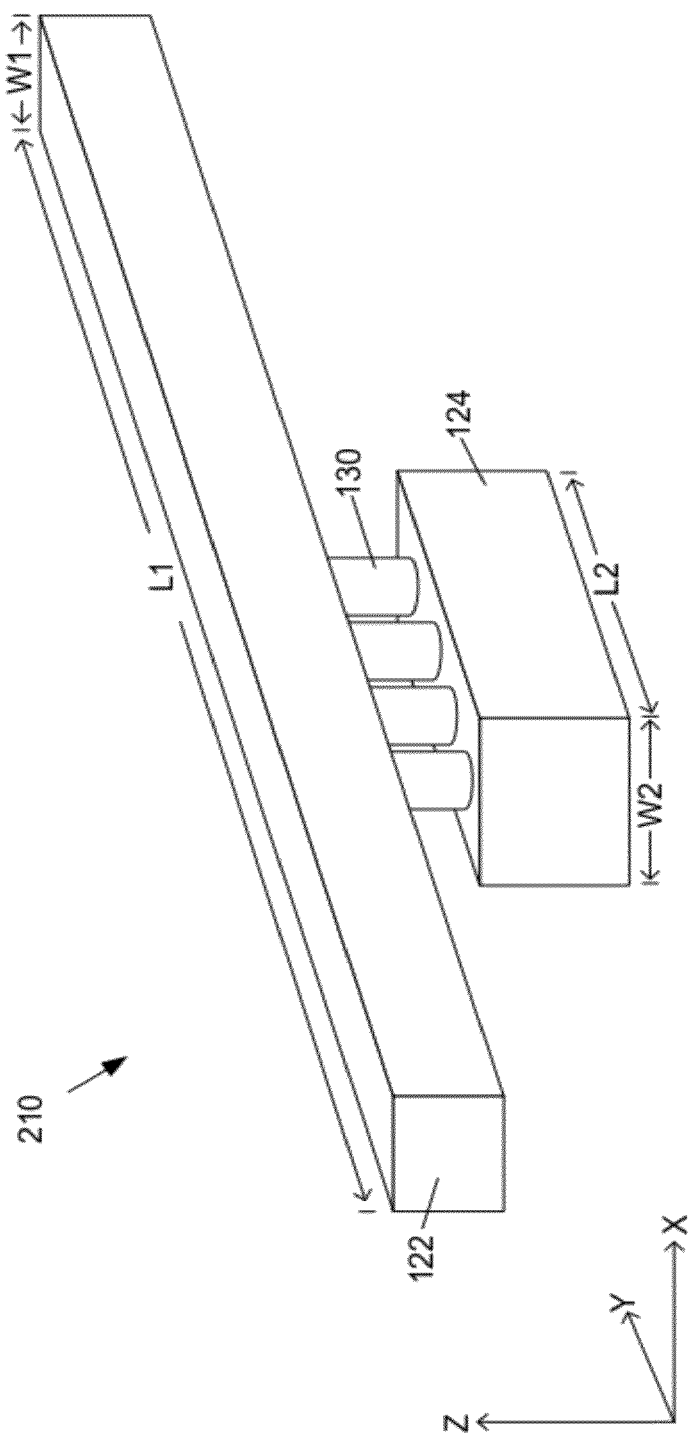
FIG. 6 shows a three dimensional view of a conductive plate in accordance with an embodiment of the present invention.
Figure 7:
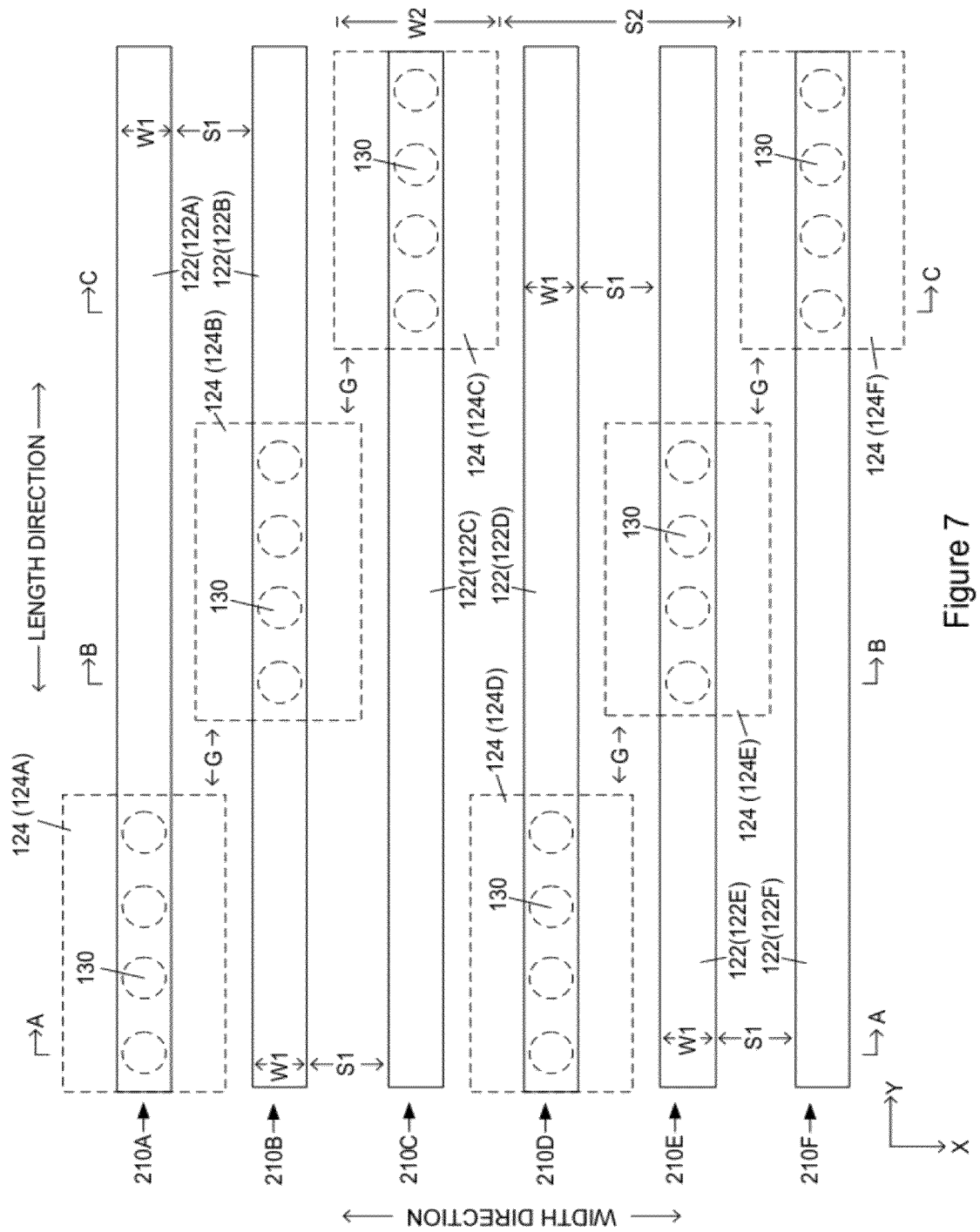
FIG. 7 shows a top view of the capacitor structure from FIG. 5.
Figure 8A:
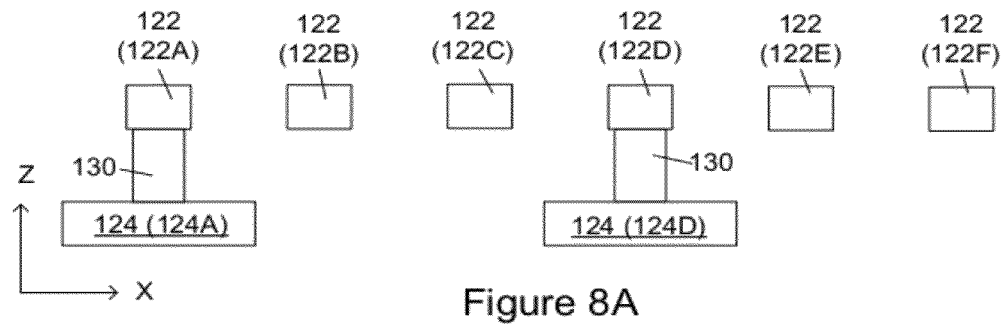
FIG. 8A shows a cross sectional view of the capacitor structure from FIG. 7.
Figure 8B:
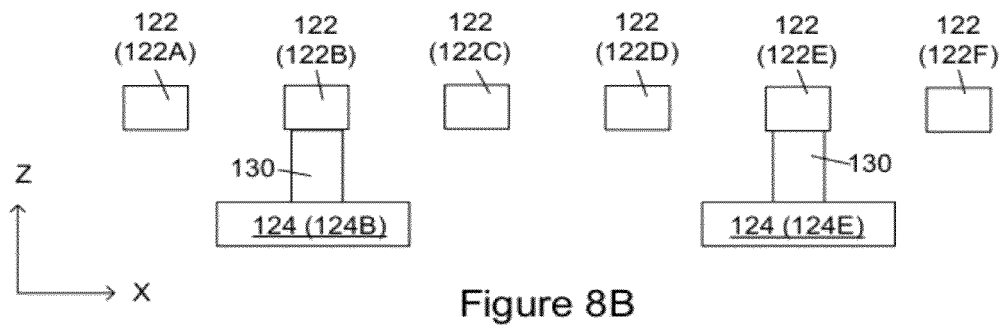
FIG. 8B shows a cross sectional view of the capacitor structure from FIG. 7.
Figure 8C:
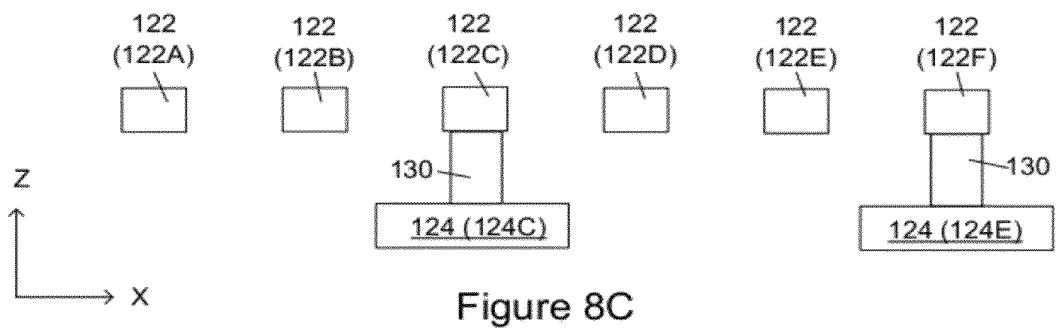
FIG. 8C shows a cross sectional view of the capacitor structure from FIG. 7.

FIG. 5 shows a three-dimensional view of a capacitor structure 200 which is another embodiment of the present invention. FIG. 6 shows an example of a conductive plate 210 from FIG. 5. FIG. 7 shows a top view of the same capacitor structure 200 from FIG. 5. FIG. 8A shows a cross sectional view of the capacitor structure 200 through the cross section AA (shown in FIG. 7). FIG. 8B shows a cross sectional view of the capacitor structure 200 through the cross section BB (shown in FIG. 7). FIG. 8C shows a cross sectional view of the capacitor structure 200 through the cross section CC (shown in FIG. 7).

The discussion above related to the capacitor structure 100 and to the conductive plates 110 as shown in FIGS. 1-4 is applicable here for the capacitor structure 200 and the conductive plates 210 shown in FIGS. 5-8 (i.e., FIG. 5, FIG. 6, FIG. 7, FIG. 8A, FIG. 8B, FIG. 8C). The difference is that, in the embodiment shown in FIGS. 5-8, each conductive plate 210 of capacitor structure 200 includes a first conductive strip 122 and at least one second conductive strip 124 which is disposed under the first conductive strip 122 (rather than disposed over a first conductive strip 122 as shown in FIGS. 1-4).

Referring to the embodiment shown in FIGS. 5-8, in one or more embodiments, the second conductive strips 124 may be formed as part of a lower metallization level Mn and the first conductive strips 122 may be formed as part of an upper metallization level Mn+1 which is above the lower metallization level Mn. Each second conductive strip 124 is coupled to a corresponding first conductive strip through at least one conductive via 130.

Figure 9A:
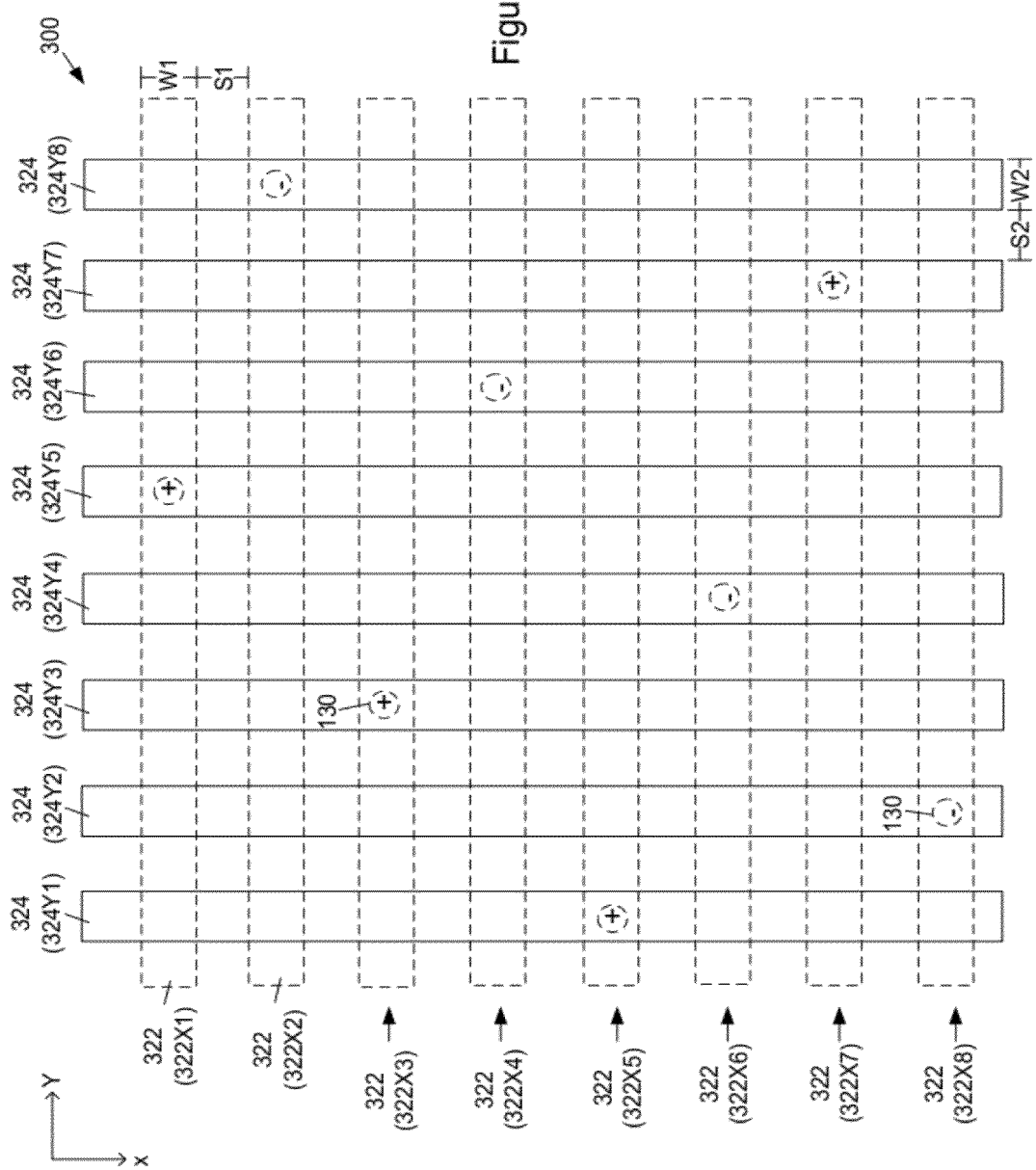
FIG. 9A shows an embodiment of a capacitor structure in accordance with an embodiment of the present invention.
Figure 9B:
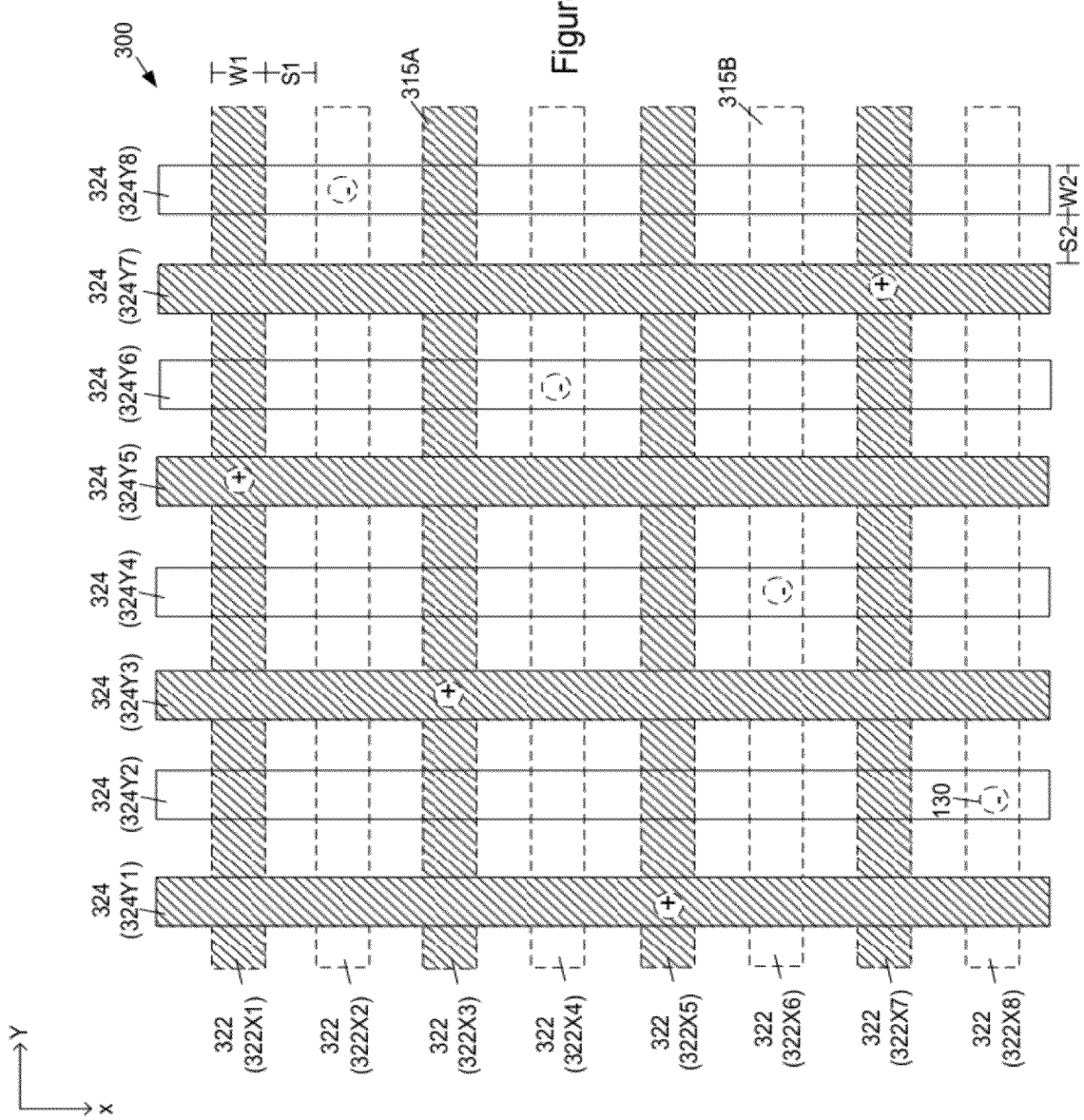
FIG. 9B shows an embodiment of a capacitor structure in accordance with an embodiment of the present invention.
Figure 9C:
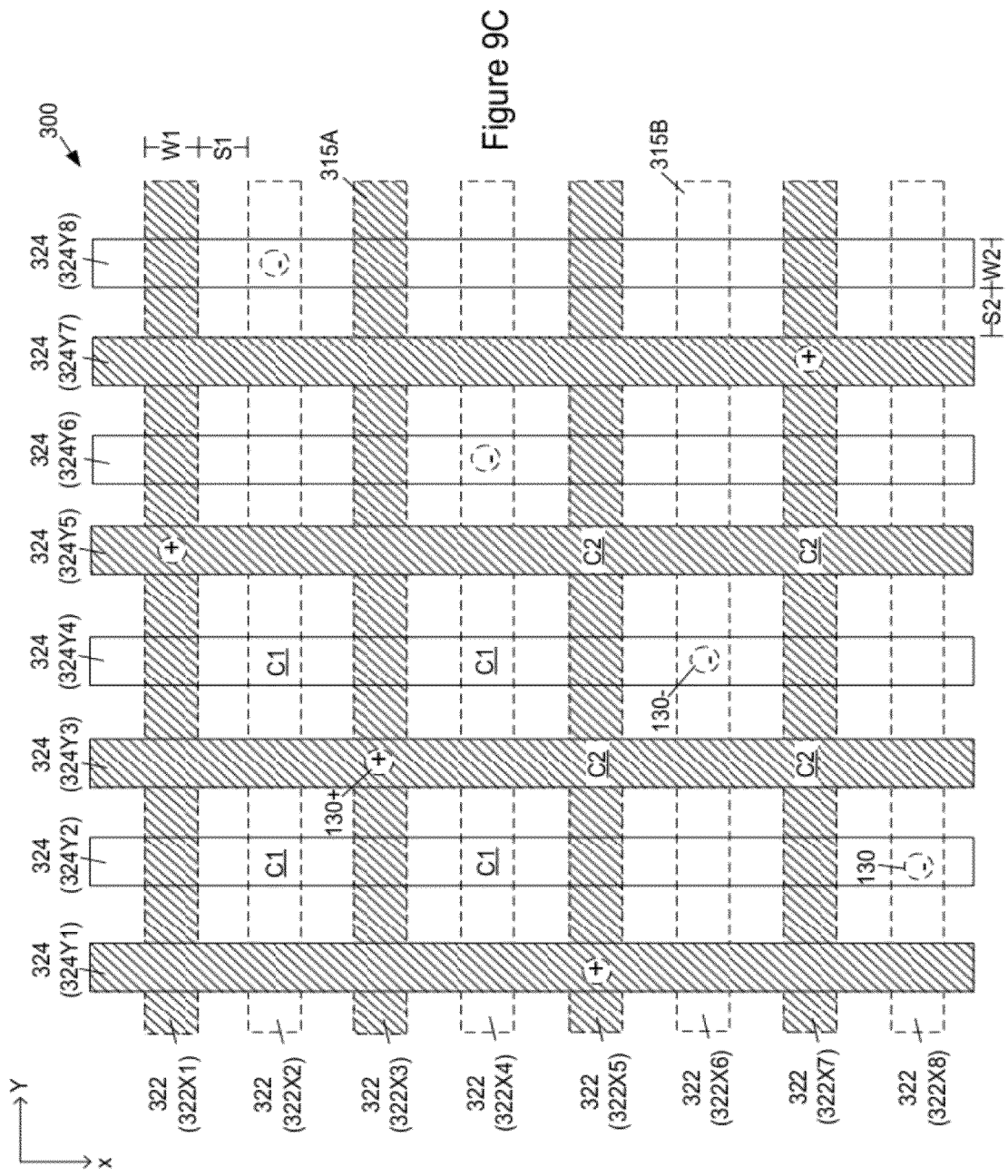
FIG. 9C shows an embodiment of a capacitor structure in accordance with an embodiment of the present invention.

Referring to FIGS. 9A-C (i.e. FIG. 9A, FIG. 9B, FIG. 9C), another embodiment of the invention is a capacitor structure 300. The capacitor structure 300 includes a plurality of first conductive strips 322. The capacitor structure 300 further includes a plurality of second conductive strips 324 disposed over the first conductive strips. In one or more embodiments the first conductive strips 322 may be substantially parallel to each other. In one or more embodiments, the second conductive strips 324 may be substantially parallel to each other. In one or more embodiments, the first conductive strips 322 may be substantially perpendicular to the second conductive strips 324. In the embodiment shown, the first conductive strips 322 are oriented in the Y-direction so that their lengths extend in the Y-direction (and their widths in the X-direction). In the embodiment shown, the second conductive strips 324 are oriented in the X-direction so that their lengths extend in the X-direction (and the widths in the Y-direction). In one or more embodiments, each of the second conductive strips 324 may cross over each of the first conductive strips 322.

In other embodiments, the first conductive strips 322 may extend lengthwise in a first direction and the second conductive strips 324 may extend lengthwise in a second direction different from the first direction. In one or more embodiments, the first direction may be substantially perpendicular to the Y-direction. In one or more embodiments, the first and second conductive strips may form a grid structure.

In the example shown in FIG. 9A, each of the first conductive strips 322 is coupled to a second conductive strip 324 by at least one conductive via 130. For example, referring to FIG. 9A, first strip 322X1 is coupled to second strip 324Y5 by a conductive via 130. Also, first strip 322X3 is coupled to second strip 324Y3 by a conductive via 130, first strip 322X5 is coupled to second strip 324Y1 by a conductive via, and first strip 322X7 is coupled to second strip 324Y7 by a conductive via 130.

The first, second conductive strip pairs (322X1, 324Y5), (322X3, 324Y8), (322X5, 324Y1), (322X7, 324Y7) may all be electrically coupled together to form a first electrode of the capacitor structure 300.

Likewise, referring to FIG. 9A, first strip 322X2 is coupled to second strip 324Y8 by a conductive via 130. Also, first strip 322X4 is coupled to second strip 324Y6 by a conductive via 130, first strip 322X6 is coupled to second strip 324Y4 by a conductive via 130, first strip 322X8 is coupled to second strip 324Y2 by a conductive via 130.

The first, second conductive strip pairs (322X2, 324Y8), (322X4, 324Y6), (322X6, 324Y4), (322X8, 324Y2) may all be electrically coupled together to form a second electrode of the capacitor structure 300.

Referring to FIG. 9A, it is noted that the conductive vias 130 that are marked (+) couple a first conductive strip to a second conductive strip and are part of the first capacitor electrode. Likewise, the conductive vias 130 that are marked (−) couple a first conductive strip to a second conductive strip and are part of the second capacitor electrode.

Referring to FIG. 9B, it is seen that the first electrode of the capacitor 300 is represented by the cross-hatched (e.g. darkened) grid structure. Likewise, the second electrode of the capacitor 300 is represented by the non cross-hatched (e.g. non-darkened) grid structure.

In one or more embodiments, each of the first conductive strips 322 may have a width or dimension W1 in the X-direction. Also, the distance between adjacent first conductive strips 322 may be a distance S1 in the X-dimension. Hence, the pitch PX of the first conductive strips 322 in the X-dimension may be a distance PX=W1+S1. In one or more embodiments, the pitch PX of the first conductive strips may be a minimum pitch.

In one or more embodiments, each of the second conductive strips 324 may have a width or dimension W2 in the Y-dimension. Also, the distance between each of the second conductive strips 324 may be a distance S2 in the Y-dimension. Hence, the pitch PY in the Y-dimension between the conductive strips 324 may be a distance PY=W2+S2. In one or more embodiments, the pitch PY of the second conductive strips 324 in the Y-dimension may be a minimum pitch.

Referring to FIGS. 9A-C, in one or more embodiments, the conductive vias 130 may be distributed such that there may be at least a distance D between the centers of any two conductive vias 130.

In one or more embodiments, the distance D between the centers of conductive vias may be such that:

$$D > \mathrm{SQRT}((S1+W1)^2 + (S2+W2)^2)$$

where SQRT is the square root function.

In at least one embodiment, the distance D may be such that:

$$D > 1.5 \times \mathrm{SQRT}((S1+W1)^2 + (S2+W2)^2)$$

In at least one embodiment, the distance D may be such that:

$$D \geq 2 \times \mathrm{SQRT}((S1+W1)^2 + (S2+W2)^2)$$

Referring to the embodiment shown in FIG. 9C, it is seen that, for each of the conductive vias 130 belonging to a particular capacitor electrode (e.g. to either the cross-hatched grid 315A or the non cross-hatched grid 315B), the neighboring corner cross points for the opposite capacitor electrode do not include conductive vias. For example, the conductive via 130+ shown in FIG. 9C couples the first conductive strip 322X3 to the second conductive strip 324Y3. The conductive via 130+ is part of the first capacitor electrode 315A (e.g. the cross-hatched grid). For the conductive via 130+, there are four neighboring corner cross points that belong to the opposite conductive electrode 315B (e.g., the non cross-hatched grid). These corner cross points are marked C1 and do not include conductive vias. Likewise, the conductive via 130− shown in FIG. 9C couples the first conductive strip 322X6 to the second conductive strip 324Y4. This conductive via 130− is part of the second conductive electrode 315B (e.g. the non cross-hatched grid). For this conductive via 130−, there are four neighboring corner cross points of the first capacitor electrode 315A (e.g. the cross-hatched grid). These corner cross points are marked C2 and do not include conductive vias.

Generally, the first and second conductive strips as well as conductive vias disclosed herein may comprise any conductive material. In one or more embodiments, the conductive material may comprise a metallic material. The metallic material may comprise a pure metal. The metallic material may comprise a metal alloy. The metallic material may comprise, without limitation, one or more elements from the group consisting of Al, Cu, Au, Ag, W, Ti, and Ta.

As possible examples, the conductive strips and/or the conductive vias may comprise one or more materials selected from the group consisting of pure aluminum, aluminum alloy, pure copper, copper alloy, pure gold, gold alloy, pure silver, silver alloy, pure tungsten, tungsten alloy, pure titanium, titanium alloy, pure tantalum, and tantalum alloy.

It is possible that the conductive vias and conductive strips be formed of a non-metallic conductive material. For example, the conductive material may be a doped polysilicon material (such as n-type doped or p-type doped). The doping may, for example, be performed by implantation or it may be done in-situ. The conductive material may also be formed of a conductive polymer.

The capacitor structures of the present invention may be integrated as part of a semiconductor chip or integrated circuit.

The semiconductor chip or integrated circuit may include a substrate. The substrate may be a semiconductor substrate. The capacitor structures described herein may be formed over the substrate, on the substrate and/or within the substrate.

The substrate may be any type of semiconductor substrate. In an embodiment, the substrate may be a p-type substrate. However, more generally, in one or more embodiments of the invention, the substrate may be a silicon substrate or other suitable substrate. The substrate may be a bulk substrate such as a mono-crystallayer silicon substrate (or a grown thereon or otherwise formed therein), a of (110) silicon on a (100) silicon wafer, a silicon-on-insulator (SOI) substrate. The SOI substrate may, for example, be formed by a SIMOX process. The substrate may be a silicon-on-sapphire (SOS) substrate. The substrate may be a germanium-on-insulator (GeOI) substrate. The substrate may include one or more materials such as semiconductor materials such as silicon germanium, germanium, germanium arsenide, indium arsenide, indium arsenide, indium gallium arsenide, or indium antimonide.

The conductive plates described herein may comprise conductive strips. In one or more embodiments, each of the conductive strips may be formed of conductive lines belonging to various metallization levels of a semiconductor chip or integrated circuit. This includes, for example, metallization level 1, metallization level 2, etc. The metallization levels may be formed over a substrate (such as a semiconductor substrate).

In one or more embodiments, the conductive vias may, for example, be formed as conductive interconnects through the inter-level dielectric layers between one metallization level and another metallization level. In one or more embodiments, the conductive vias may be formed as conductive interconnects through the dielectric between the substrate and the first metallization level (e.g. metallization level 1). In one or more embodiments, the conductive vias may be formed as conductive interconnects through the substrate (such as a semiconductor substrate) of a semiconductor chip (such as, for example, through-substrate vias or through-silicon vias).

The capacitor structures described herein may comprise a first capacitor electrode and a second capacitor electrode. The first and second capacitor electrodes may be separated by a dielectric. The first electrode may be electrically coupled to a first node on the same semiconductor chip as the capacitor or to a first node on a different chip from the capacitor. Likewise, the second capacitor electrode may be electrically coupled to a second node on the same semiconductor chip as the capacitor or to a node on a semiconductor chip which is different from the capacitor.

In one or more embodiments, conductive lines (such as metallization lines) which are above the capacitor, below the capacitor or on the same level as the capacitor may be used to electrically couple the first and second capacitor electrodes to nodes that are either on the same semiconductor chip (or the same integrated circuit) or on a different semiconductor chip (or on a different semiconductor circuit). In one or more embodiments, conductive vias may also be used for purposes of electrical coupling.

One or more embodiments relate to a semiconductor chip comprising a capacitor, the capacitor comprising: a plurality of conductive plates, each of the plates including a first conductive strip and a second conductive strip disposed over or under the first conductive strip, the second conductive strip of each plate being substantially parallel to the first conductive strip of the same plate, the second conductive strip of each plate electrically coupled to the first conductive strip of the same plate through at least one conductive via, the second conductive strips of each group of at least two consecutive plates being spaced apart from each other in a direction along the length of the plates.

One or more embodiments related to a semiconductor chip comprising a capacitor, the capacitor comprising: a plurality of first conductive strips disposed in a first metallization level; a plurality of second conductive strips disposed in a second metallization level adjacent to the first metallization level, each of the second strips being electrically coupled to a corresponding one of the first strips, each of the second strips being substantially parallel to the corresponding one of the first strips, the second conductive strips corresponding to each group of at least two consecutive first conductive strips being spaced apart from each other in a direction along the length of the first conductive strips.

One or more embodiments related to a semiconductor chip comprising a capacitor, the capacitor comprising: a plurality of substantially parallel first conductive strips disposed in a first metallization level, the first conductive strips having a minimum pitch in a direction along the width of the first strips; and a plurality of second conductive strips disposed in an adjacent second metallization level, each of the second strips being electrically coupled to a corresponding one of the first conductive strips by at least one conductive via, each of the second strips being substantially parallel to the corresponding one of the first conductive strips, the conductive second strips having a relaxed pitch in the direction along the width of the first strips.

One or more embodiments related to a semiconductor chip comprising a capacitor, the capacitor comprising: a plurality of substantially parallel first conductive strips oriented in a first direction, the first conductive strips comprising a first group of first strips and a second group of first strips alternating with the first group of first strips; a plurality of substantially parallel second conductive strips crossing the first conductive strips, the second strips oriented in a second direction different from the first direction, the second strips comprising a first group of second strips and a second group of second strips alternating with the first group of second strips, the first group of first strips crossing the first group of second strips to form first cross points, the second group of first strips crossing the second group of second strips to form second cross points; a plurality of first conductive vias coupled between the first group of first strips and the first group of second strips; and a plurality of second conductive vias coupled between the second group of first strips and the second group of second strips, wherein the first cross points adjacent the second vias do not include first vias, and wherein the second cross points adjacent the first vias do not include second vias.

One or more embodiments relate to a semiconductor chip comprising a capacitor, the capacitor comprising: eight substantially parallel first conductive strips oriented in a first direction, the first conductive strips comprising a first group of first strips and a second group of first strips alternating with the first group of first strips; eight substantially parallel second conductive strips crossing the first conductive strips, the second strips oriented in a second direction different from the first direction, the second strips comprising a first group of second strips and a second group of second strips alternating with the first group of second strips, the first group of first strips crossing the first group of second strips to form first cross points, the second group of first strips crossing the second group of second strips to form second cross points; at most four first conductive vias coupled between the first group of first strips and the first group of second strips; and at most four second conductive vias coupled between the second group of first strips and the second group of second strips.

The disclosure herein is presented in the form of detailed embodiments described for the purpose of making a full and complete disclosure of the present invention, and that such details are not to be interpreted as limiting the true scope of this invention as set forth and defined in the appended claims.

What is claimed is:

1. A semiconductor chip comprising a capacitor, said capacitor comprising:
a plurality of conductive plates, each of said plates including a first conductive strip and a second conductive strip disposed over or under said first conductive strip, the second conductive strip of each plate being substantially parallel to the first conductive strip of the same plate, the second conductive strip of each plate electrically coupled to the first conductive strip of the same plate through at least one conductive via, the second conductive strips of each group of at least two consecutive plates being spaced apart from each other in a direction along the length of the plates.

2. The chip of claim 1, wherein the second conductive strips of each group of at least three consecutive plates are spaced apart from each other in a direction along the length of the plates.

3. The chip of claim 2, wherein the second conductive strips of every fourth plate overlap in a direction along the length of the plates.

4. The chip of claim 1, wherein said conductive plates are alternately electrically coupled together creating a first portion of plates and a second portion of plates, said first portion of plates forming a first electrode of said capacitor structure and said second portion of plates forming a second electrode of said capacitor structure.

5. The chip of claim 1, wherein the second conductive strip of each of said plates is disposed over the first conductive strip of the corresponding plate.

6. The chip of claim 1, wherein said second conductive strip of each of said plate is disposed under the first conductive strip of the corresponding plate.

7. The chip of claim 1, wherein the first conductive strip of each of said plates are formed in a first metallization level and the second conductive strip of each of said plates are formed in a second metallization level different from said first metallization level.

8. The chip of claim 7, wherein said second metallization level is above is first metallization level.

9. The chip of claim 7, wherein said second metallization level is below is first metallization level.

10. The chip of claim 1, wherein the first conductive strips of said conductive plates have minimum pitch in a direction along the width of said plates.

11. The chip of claim 1, wherein the first conductive strips of said plurality of plates are substantially parallel to each other.

12. The chip of claim 1, wherein said plurality of conductive plates are substantially parallel to each other.

13. A semiconductor chip comprising a capacitor, said capacitor comprising:
a plurality of first conductive strips disposed in a first metallization level;
a plurality of second conductive strips disposed in a second metallization level adjacent to said first metallization level, each of said second strips being electrically coupled to a corresponding one of said first strips, each of said second strips being substantially parallel to the corresponding one of said first strips, the second conductive strips corresponding to each group of at least two consecutive first conductive strips being spaced apart from each other in a direction along the length of said first conductive strips.

14. The chip of claim 13, wherein the second conductive strips corresponding to each group of at least three consecutive first conductive strips being spaced apart from each other in a direction along the lengths of said first conductive strips.

15. The chip of claim 14, wherein the second conductive strips corresponding to each fourth first conductive strip overlapping each other in a direction along the lengths of said first conductive strips.

16. The chip of claim 13, wherein said second metallization level is above said first metallization level and each of said second strips is over said corresponding first strips.

17. The chip of claim 13, wherein said second metallization level is below said first metallization level and each of said second strips is below said corresponding first strips.

18. The chip of claim 13, wherein said first conductive strips are substantially parallel to each other.

19. The chip of claim 13, wherein said first conductive strips have a minimum pitch in the direction along the widths of said first conductive strips.

20. A semiconductor chip comprising a capacitor, said capacitor comprising:
a plurality of substantially parallel first conductive strips disposed in a first metallization level, said first conductive strips having a minimum pitch in a direction along the width of said first strips; and
a plurality of second conductive strips disposed in an adjacent second metallization level, each of said second strips being electrically coupled to a corresponding one of said first conductive strips by at least one conductive via, each of said second strips being substantially parallel to the corresponding one of said first conductive strips, said conductive second strips having a relaxed pitch in the direction along the width of said first strips.

21. The chip of claim 20, wherein said second metallization level is above said first metallization level and each of said second strips is over said corresponding first strips.

22. The chip of claim 20, wherein said second metallization level is below said first metallization level and each of said second strips is below said corresponding first strips.

* * * * *